(12) United States Patent
Geng et al.

(10) Patent No.: US 8,880,975 B2
(45) Date of Patent: Nov. 4, 2014

(54) METHOD AND DEVICE FOR INFORMATION BLOCK CODING AND SYNCHRONIZATION DETECTING

(75) Inventors: Dongyu Geng, Shenzhen (CN); Dongning Feng, Shenzhen (CN); Raymond W. K. Leung, Shenzhen (CN); Frank Effenberger, Freehold, NJ (US)

(73) Assignee: Huawei Technologies Co., Ltd., Shenzhen (CN)

( * ) Notice: Subject to any disclaimer, the term of this patent is extended or adjusted under 35 U.S.C. 154(b) by 345 days.

(21) Appl. No.: 12/623,798

(22) Filed: Nov. 23, 2009

(65) Prior Publication Data

US 2010/0070823 A1 Mar. 18, 2010

Related U.S. Application Data

(63) Continuation of application No. PCT/CN2008/071069, filed on May 23, 2008.

(30) Foreign Application Priority Data

May 26, 2007 (CN) .......................... 2007 1 0106648

(51) Int. Cl.
H03M 13/00 (2006.01)
H03M 13/03 (2006.01)
G06F 11/00 (2006.01)
H03M 13/33 (2006.01)
H04L 1/00 (2006.01)
H04L 7/04 (2006.01)
H03M 13/05 (2006.01)

(52) U.S. Cl.
CPC ............ *H03M 13/333* (2013.01); *H03M 13/33* (2013.01); *H03M 13/6522* (2013.01); *H03M 13/05* (2013.01); *H04L 1/0057* (2013.01); *H04L 7/041* (2013.01)

USPC ........................... 714/755; 714/789; 714/798

(58) Field of Classification Search
CPC ... H03M 13/333; H03M 13/33; H03M 13/05; H03M 13/6522
USPC .......................................... 714/755, 789, 798
See application file for complete search history.

(56) References Cited

U.S. PATENT DOCUMENTS 3,913,068 A * 10/1975 Patel .............................. 714/755
4,375,100 A * 2/1983 Tsuji et al. .................... 714/755
(Continued)

FOREIGN PATENT DOCUMENTS

CN 1320265 A 10/2001
CN 1825969 A 8/2006
(Continued)

OTHER PUBLICATIONS

Gray code—Wikipedia, the free encyclopedia, http://en.wikipedia.org/wiki/Gray_code, Nov. 28, 2012.*
(Continued)

*Primary Examiner* — Joseph D Torres
(74) *Attorney, Agent, or Firm* — Huawei Technologies Co., Ltd.

(57) ABSTRACT

A method and a device for information block coding and synchronization detecting are provided. Information block coding and synchronization detecting may be performed according to a synchronization character sequence satisfying certain conditions. Thus, the probability of incorrect synchronization may be effectively reduced without increasing the complexity. Optimal synchronization character sequences in different lengths are provided to further reduce the probability of incorrect synchronization.

4 Claims, 7 Drawing Sheets

(56) References Cited

U.S. PATENT DOCUMENTS

| | | | |
|---|---|---|---|
| 4,644,544 A * | 2/1987 | Furuya et al. | 714/755 |
| 4,646,290 A * | 2/1987 | Hills | 370/345 |
| 4,649,543 A * | 3/1987 | Levine | 714/774 |
| 4,680,764 A * | 7/1987 | Suzuki et al. | 714/756 |
| 4,748,623 A * | 5/1988 | Fujimoto | 370/513 |
| 4,849,995 A * | 7/1989 | Takeo et al. | 375/368 |
| 4,937,843 A * | 6/1990 | Takemoto | 375/368 |
| 4,984,238 A * | 1/1991 | Watanabe et al. | 370/509 |
| 5,289,476 A * | 2/1994 | Johnson et al. | 714/775 |
| 5,768,298 A * | 6/1998 | Nagai et al. | 714/769 |
| 5,881,037 A * | 3/1999 | Tanaka et al. | 369/59.24 |
| 5,896,405 A * | 4/1999 | Moon | 714/795 |
| 5,901,159 A * | 5/1999 | Ichikawa | 714/765 |
| 5,917,836 A * | 6/1999 | Ichikawa et al. | 714/755 |
| 5,974,106 A * | 10/1999 | Dupont et al. | 375/377 |
| 6,041,029 A * | 3/2000 | Iida et al. | 369/47.18 |
| 6,125,156 A * | 9/2000 | Watanabe | 375/368 |
| 6,263,469 B1 * | 7/2001 | Jang | 714/775 |
| 6,401,228 B1 * | 6/2002 | Ichikawa et al. | 714/755 |
| 6,473,477 B2 * | 10/2002 | Watanabe | 375/368 |
| 6,536,011 B1 * | 3/2003 | Jang et al. | 714/814 |
| 6,650,638 B1 | 11/2003 | Walker et al. | |
| 6,675,267 B2 * | 1/2004 | Rovati | 711/150 |
| 6,718,491 B1 | 4/2004 | Walker et al. | |
| 7,102,973 B1 * | 9/2006 | Carson | 369/53.21 |
| 7,145,852 B2 * | 12/2006 | Lin et al. | 369/47.34 |
| 7,149,177 B2 * | 12/2006 | Yabuno et al. | 369/275.3 |
| 7,213,190 B2 * | 5/2007 | Tatsuzawa | 714/755 |
| 7,266,753 B2 * | 9/2007 | Tomita | 714/776 |
| 7,313,069 B2 * | 12/2007 | Tomita | 369/53.35 |
| 7,376,169 B2 * | 5/2008 | Henrichs | 372/99 |
| 7,404,135 B2 * | 7/2008 | Tomita | 714/752 |
| 7,415,650 B2 * | 8/2008 | Tomita | 714/752 |
| 7,480,849 B2 * | 1/2009 | Tomita | 714/775 |
| 7,484,163 B2 * | 1/2009 | Tomita | 714/775 |
| 7,484,164 B2 * | 1/2009 | Tomita | 714/775 |
| 7,512,866 B2 * | 3/2009 | Tomita | 714/775 |
| 7,545,721 B2 * | 6/2009 | Tomita | 369/53.35 |
| 7,627,246 B2 * | 12/2009 | Sorin et al. | 398/63 |
| 2004/0030983 A1 * | 2/2004 | Tomita | 714/776 |
| 2004/0258410 A1 | 12/2004 | Yajima et al. | |
| 2005/0005189 A1 | 1/2005 | Khermosh et al. | |
| 2006/0015790 A1 | 1/2006 | Bansal | |
| 2010/0098413 A1 * | 4/2010 | Li et al. | 398/38 |
| 2010/0251079 A1 * | 9/2010 | Geng et al. | 714/781 |

FOREIGN PATENT DOCUMENTS

| | | |
|---|---|---|
| CN | 1949761 A | 4/2007 |
| CN | 1964354 A | 5/2007 |
| EP | 1 434 397 A1 | 6/2004 |

OTHER PUBLICATIONS

International Search Report from P.R. China in International Application No. PCT/CN2008/071069 mailed Sep. 4, 2008.

Lui, et al., "Analysis and Implementation of FEC in EPON Optical Communication Technology", vol. 3, pp. 14-16, (Mar. 31, 2006).

Office action issued in corresponding U.S. Appl. No. 13/075,931, Feb. 15, 2012, total 27 pages.

First office action issued in corresponding European patent application No. 08748671.8, dated Jan. 9, 2013, total 5 pages.

Supplementary European Search Report dated (mailed) Jul. 21, 2010, issued in related Application No. 08748671.8-1237, PCT/CN2008071069, filed May 23, 2008, Hauwei Technologies Co., Ltd.

Written Opinion of the International Searching Authority (translation) dated (mailed) Sep. 4, 2008, issued in related Application No. PCT/CN2008/071069, filed May 23, 2008, Huawei Technologies Co., Ltd.

Frank Effenberger et al., FEC Synchronization and Framing, P802.3av, Monterey, CA, Jan. 15, 2007. 26 pgs.

European Broadcasting Union, Radio broadcasting systems; DAta Radio Channel (DARC); System for wireless infotainment forwarding and teledistribution; ETSI EN 300 751 V1.2.1. (Jan. 2003), 75 pgs.

IEEE, Part 3: Carrier Sense Multiple Access with Collision Detection (CSMA/CD) access method and physical layer specifications, Information technology—Telecommunications and information exchange between systems—Local and metropolitan area networks—Specific requirements-, Std.802.3:, 454 pgs.

* cited by examiner

METHOD AND DEVICE FOR INFORMATION BLOCK CODING AND SYNCHRONIZATION DETECTING

CROSS-REFERENCE TO RELATED APPLICATIONS

This application is a continuation of International Application No. PCT/CN2008/071069, filed on May 23, 2008, which claims priority to Chinese Patent Application No. 200710106648.7, filed on May 26, 2007, both of which are hereby incorporated by reference in their entireties.

FIELD OF THE TECHNOLOGY

The disclosure relates to the communication field, and more particularly to information coding and synchronization detecting technologies.

BACKGROUND

With the continuous development of communication technologies, users have increasingly high requirements for the quality of service such as capacity and speed of the communication. Access network is the most challenging region in the entire telecommunication network. To satisfy the users' demand for bandwidth, and to realize a high-speed, broadband, and intelligent access network, different access technologies have been proposed one after another. Among those access technologies, the most promising one is the passive optical network (PON) technology, and in particular Ethernet passive optical network (EPON) technology.

The EPON technology is mainly characterized in a simple maintenance, low cost, high transmission bandwidth, and high price performance ratio. In particular, the EPON technology provides a bandwidth of 1 GHz or even 10 GHz, which realizes the synchronous transmission of voice, data, and video services.

The EPON is a passive optical transmission technology, without using components having amplification and relay functions. Therefore, the transmission distance and number of branches of the EPON network depend on the power budget and various transmission losses. With the increase of the transmission distance or number of branches, a signal noise ratio (SNR) of the data transmission decreases gradually, which leads to more bit errors. To solve this problem, a forward error correction (FEC) technology is introduced into the EPON system to improve the interference resistance capability of the system, so as to increase the power budget of the system.

The basic operating principles of the FEC in the EPON system are as follows: FEC check code words are appended to Ethernet frames transmitted at a sending end, in which the check code words are associated with (constrained by) the Ethernet frame data to be checked according to certain determinate rules; and a receiving end checks the relationship between the Ethernet frame data and the check code words according to predetermined rules, where the relationship is destroyed once an error occurs during transmission, so as to realize the error correction of the Ethernet frame data. The FEC technology strives for correcting maximum possible errors with minimum possible check bytes, so as to achieve an optimal balance between the overhead (caused by the additional check bytes) and the obtained coding gain.

In the EPON system, in order to ensure that the sent data is in a format acceptable to the receiving end, before the FEC technology is adopted, a line coding technology may be employed. In addition, the line coding facilitates adequate transition (between 0 and 1) of the sent data, so as to enable the receiving end to recover a clock. A line coder further provides a method for aligning data with words, in which a fine direct current (DC) balance is maintained on the line.

Standards associated with the Ethernet system have already employed line coding mechanisms with a higher coding efficiency, such as 64b/66b, in a physical coding sublayer (PCS). The 64b/66b line coding mechanism adds a 2-bit synchronization character to the 64-bit information to serve as a synchronization header, so as to form a 66-bit line coding block. Normally, the 2-bit synchronization character may be only "01" or "10". The synchronization character of "01" indicates that the 64-bit information is all data, and the synchronization character of "10" indicates that the 64-bit information contains control information with or without data information. When the synchronization character is "00" or "11", it indicates that error occurs during transmission. When the number of line coding blocks after the 64b/66b line coding process reaches a data length required by the FEC coding, the FEC coding is performed. The corresponding check information is generated after the FEC coding. The length of the check information is a multiple of 64, so that the check information blocks formed by check information are in a unit of 64 bits. Then, a 2-bit synchronization character ("00" or "11") is added at the head of each check information block to serve as a synchronization header of the check information block, so as to form a 66-bit check information block with a check information block synchronization header. For convenience of description, a 64-bit check information block and the 2-bit check information block synchronization header are together referred to as a check block, and the length of one check block is 66 bits.

That is, the lengths of the line coding blocks and check blocks after FEC coding are both 66 bits. Each line coding block contains a 2-bit synchronization header and a 64-bit data information block, in which the two bits of the synchronization header are always different; each check block contains a 2-bit synchronization header and a 64-bit check information block, in which the two bits of the synchronization header are always the same. Thus, the receiving end performs the synchronization based on characteristics of the synchronization headers in the line coding blocks and check blocks, so as to determine the start and end positions of an FEC code word (a complete FEC code word contains several line coding blocks and several check blocks).

Currently, a structure of an FEC code word (the code word contains K line coding blocks and M check blocks) is as shown in FIG. 1. Each line coding block contains a synchronization header having two different bits and a 64-bit data information block Di (i=1, 2, . . . K), and each check block contains a synchronization header having two same bits and a 64-bit check information block Pi (i=1, 2, . . . M). The synchronization header of the first check information block P1 is "00", and the synchronization header of any other check information blocks Pi (i=2, 3, . . . M) is "11". Therefore, the receiving end performs an FEC code word synchronization based on characteristics of the synchronization headers.

However, the synchronization headers of the data information blocks may change from the original "01" or "10" to "00" or "11" and the synchronization headers of the check information blocks may also change because of the noise interference in the transmission, sometimes resulting in incorrect synchronization.

For example, the structure of an FEC code word is described as follows.

(1) The number of data information blocks is K, and the number of check information blocks is M (M=4), and thus, the number of information blocks contained in the FEC code word is N, N=K+M=K+4.

(2) The check information blocks are always added to tail ends of the data information blocks.

(3) Every N information blocks and the corresponding synchronization headers form one FEC code word, and a plurality of FEC code words are connected in a head to tail manner to form a string of information sequence.

As shown in the "incorrect synchronization 1" part of FIG. 2, when one bit in the synchronization header of the $K^{th}$ (i.e. the $(i+K-1)^{th}$ position in FIG. 2) data information block in the FEC code word has an error, the original "01" or "10" is changed to "00" (i.e. changed to the synchronization header of the first check information block); meanwhile, the synchronization header of the first check information block of the FEC code word is changed from the original "00" to "11" (i.e. changed to the synchronization header of the second check information block); the synchronization header of the second and the third check information blocks remains unchanged and are still "11"; and one bit in the synchronization header of the fourth (i.e. the $(i-1)^{th}$ position in FIG. 2) check information block in the previous FEC code word has an error, that is, the original "11" is changed to "10" or "01" (i.e. changed to a synchronization header of a data information block). At this time, the receiving end mistakes the $(i-1)^{th}$ to $(i+K+2)^{th}$ positions as one FEC code word for synchronization, and performs the synchronization accordingly. Thus, an incorrect synchronization occurs. The "incorrect synchronization 2" in FIG. 2 shows another situation leading to incorrect synchronization, which is different from the incorrect synchronization 1 mainly in that, the positions of the erroneous synchronization characters are different, and will not be described in detail here.

In the "incorrect synchronization 1" as shown in FIG. 2, the FEC code word has four erroneous synchronization bits, so as to result in the incorrect synchronization. Therefore, the number of bits leading to the incorrect synchronization of the FEC code word is four. Of course, while the errors occur in the four bits, the synchronization header of other data information blocks may also have errors so that two bits of the synchronization header both have errors. For example, a synchronization header of a certain data information block is changed from "01" to "10" or from "10" to "01", and in this case, the number of bits leading to the "incorrect synchronization 1" shown in FIG. 2 is six. However, the probability of the 6 bits errors may be ignored as compared with the probability of the 4 bits errors. Therefore, when the incorrect synchronization is calculated in statistics, only the minimum bit number leading to the incorrect synchronization of the FEC code word needs to be considered; as for the "incorrect synchronization 1" shown in FIG. 2, the minimum bit number is four. The number of check information blocks M=4, the synchronization headers of the check information blocks adopt the sequence of the prior art (that is, 00, 11, 11, 11), and various minimum bit numbers that possibly lead to the incorrect synchronization of the FEC code word are listed in Table 1. If the synchronization start point of the FEC code word is at i, it indicates a correct synchronization as the minimum error bit number at this time is 0. If the synchronization start point of the FEC code word is $(i-1)$, that is the case of "incorrect synchronization 1" in FIG. 2, the minimum error bit number is 4. Other situations are similar to the above descriptions. It should be noted that, the FEC code word repeats once every N information blocks, that is, the information blocks with start points of i, $(i+N)$, and $(i-N)$ all indicate the data information block D1 in the FEC code word.

TABLE 1

| | | | | | Start Point of the Synchronized FEC Code Word and Corresponding Minimum Error Bit Number Leading to Incorrect Synchronization | | | | | | | | |
|---|---|---|---|---|---|---|---|---|---|---|---|---|---|
| Synchronization Header of Check Information Block | | | | | (i − 4) to (i − N + 5) | i − 3 | i − 2 | i − 1 | i | i + 1 | i + 2 | i + 3 | (i + 4) to (i + N − 5) |
| M = 4 | P1_h | P2_h | P3_h | P4_h | | | | | | | | | |
| Prior Art | 0 0 | 1 1 | 1 1 | 1 1 | 8 | 8 | 6 | 4 | 0 | 4 | 6 | 8 | 8 |

That is to say, in the prior art, when one FEC code word has four errors synchronization header bits (in three synchronization characters), the incorrect synchronization may occur. Synchronization is the basis of data reception, and the incorrect synchronization may cause error in data reception. The inventors of the disclosure find that the probability of incorrect synchronization is still high in the prior art, and an improvement needs to be made to the prior art.

SUMMARY

Accordingly, the disclosure is directed to a method and a device for information block coding and synchronization detecting, which effectively reduce a probability of incorrect synchronization without increasing complexity.

In order to solve the above technical problems, an embodiment of the disclosure provides a method for information block coding. The method may include the following steps.

M continuous check information blocks are obtained through forward error correction (FEC) coding, a synchronization character is added to each of the M continuous check information blocks according to a synchronization character sequence $\{T_j\}$, and each synchronization character serves as a synchronization header, in which the synchronization character added to a $j^{th}$ information block $P_j$ is $T_j$, and the synchronization character sequence $\{T_j\}$ satisfies the following conditions:

$$\sum_{i=1}^{M-1} Diff(T_i, T_{i+1}) > 1, \text{ and } \sum_{i=1}^{M-2} Diff(T_i, T_{i+2}) > 0,$$

where $$Diff(X, Y) = \begin{cases} 0, & \text{when } X = Y \\ 1, & \text{when } X \neq Y, \end{cases}$$

$1 \leq j \leq M$, and M is in an integer greater than 3.

An embodiment of the disclosure further provides a method for synchronization detecting. The method may include the following steps.

A character is obtained every other Q bits in a continuous bit stream, and M characters are continuously obtained sequentially; if a sequence formed by the obtained M characters is the same as a predetermined synchronization character sequence $\{T_j\}$, the synchronization is successful, and locations of the M characters are taken as the locations of synchronization headers of M information blocks, in which the synchronization character sequence $\{T_j\}$ satisfies the following conditions:

$$\sum_{i=1}^{M-1} \mathit{Diff}(T_i, T_{i+1}) > 1, \text{ and } \sum_{i=1}^{M-2} \mathit{Diff}(T_i, T_{i+2}) > 0,$$

where $$\mathit{Diff}(X, Y) = \begin{cases} 0, & \text{when } X = Y \\ 1, & \text{when } X \neq Y, \end{cases}$$

$1 \leq j \leq M$, M is in an integer greater than 3, and

Q is a number of bits of the information block.

An embodiment of the disclosure provides a device for information block coding. The device includes a sequence storage module, an FEC coding module, and a first synchronization coding module.

The sequence storage module may be configured to store a synchronization character sequence $\{T_j\}$ satisfying the following conditions:

$$\sum_{i=1}^{M-1} \mathit{Diff}(T_i, T_{i+1}) > 1, \text{ and } \sum_{i=1}^{M-2} \mathit{Diff}(T_i, T_{i+2}) > 0,$$

where $$\mathit{Diff}(X, Y) = \begin{cases} 0, & \text{when } X = Y \\ 1, & \text{when } X \neq Y, \end{cases}$$

$1 \leq j \leq M$, and M is an integer greater than 3.

The FEC coding module may be configured to generate M continuous check information blocks through FEC coding.

The first synchronization coding module may be configured to add a synchronization character serving as a synchronization header to each of the M continuous information blocks generated by the FEC coding module according to the synchronization character sequence $\{T_j\}$ stored in the sequence storage module, in which the synchronization character added to a $j^{th}$ information block $P_j$ is $T_j$.

An embodiment of the disclosure provides a device for synchronization detecting. The device may include a sequence storage module, a sampling module, and a comparing module.

The sequence storage module may be configured to store a synchronization character sequence $\{T_j\}$ satisfying the following conditions:

$$\sum_{i=1}^{M-1} \mathit{Diff}(T_i, T_{i+1}) > 1, \text{ and } \sum_{i=1}^{M-2} \mathit{Diff}(T_i, T_{i+2}) > 0,$$

where $$\mathit{Diff}(X, Y) = \begin{cases} 0, & \text{when } X = Y \\ 1, & \text{when } X \neq Y, \end{cases}$$

$1 \leq j \leq M$, and M is an integer greater than 3.

The sampling module may be configured to obtain one character every other Q bits in an input continuous bit stream, and continuously obtain M characters sequentially to form a sample sequence.

The comparing module may be configured to compare the sample sequence obtained by the sampling module with the synchronization character sequence stored in the sequence storage module, record locations of the M characters in the sample sequence as locations of synchronization headers of M information blocks if the sample sequence is the same as the synchronization character sequence, and output a signal indicating that the synchronization is successful.

Some embodiments of the disclosure may include the following features and effects.

The synchronization character sequence $\{T_j\}$ satisfying the following conditions is adopted to perform the synchronization coding and synchronization detecting:

$$\sum_{i=1}^{M-1} \mathit{Diff}(T_i, T_{i+1}) > 1, \text{ and } \sum_{i=1}^{M-2} \mathit{Diff}(T_i, T_{i+2}) > 0,$$

where $$\mathit{Diff}(X, Y) = \begin{cases} 0, & \text{when } X = Y \\ 1, & \text{when } X \neq Y, \end{cases}$$

$1 \leq j \leq M$, and M is an integer greater than 3.

Thus, an incorrect synchronization problem does not occur until at least four synchronization characters have errors at the same time in the synchronization headers of the M continuous information headers. Therefore, the embodiments consistent with the disclosure may reduce the probability of incorrect synchronization.

DETAILED DESCRIPTION OF THE EMBODIMENTS

A first embodiment of the disclosure provides a method for information block coding. In this embodiment, a synchronization character serving as a synchronization header is added to each of M continuous check information blocks according to a synchronization character sequence $\{T_j\}$, in which the synchronization character added to a $j^{th}$ check information block $P_j$ is $T_j$, and the synchronization character sequence $\{T_j\}$ satisfies the following conditions:

$$\sum_{i=1}^{M-1} Diff(T_i, T_{i+1}) > 1, \text{ and } \sum_{i=1}^{M-2} Diff(T_i, T_{i+2}) > 0,$$

where $$Diff(X, Y) = \begin{cases} 0, & \text{when } X = Y \\ 1, & \text{when } X \neq Y, \end{cases}$$

$1 \le j \le M$, and $M$ is an integer greater than 3.

In this embodiment, the check information blocks are those check information blocks of FEC code words in a 10G EPON, and the synchronization characters are 00 or 11.

Figure 1:
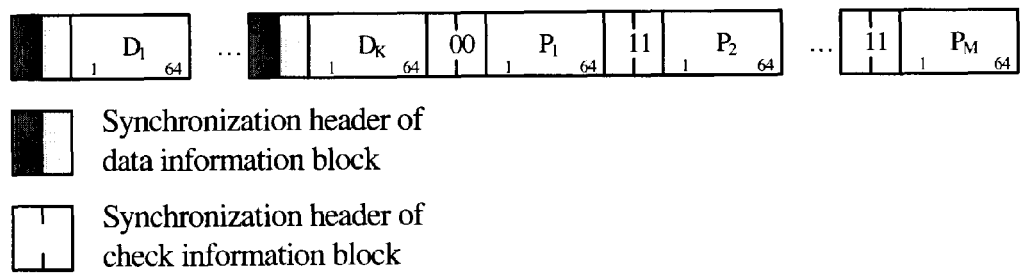
FIG. 1 is a schematic structural view of a code word after FEC coding in the prior art.
Figure 2:
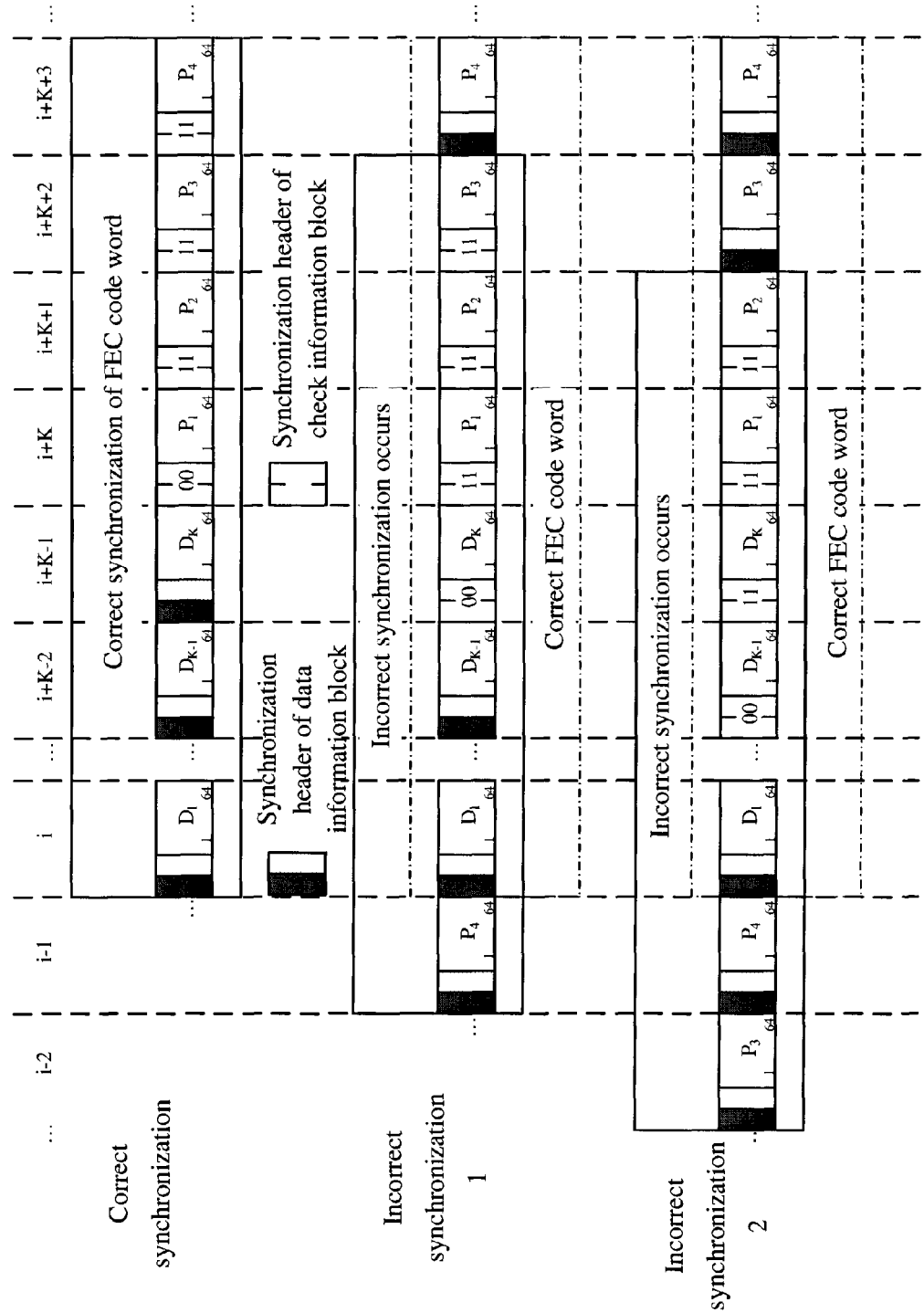
FIG. 2 is a schematic view of FEC code word synchronization in the prior art.
Figure 3:
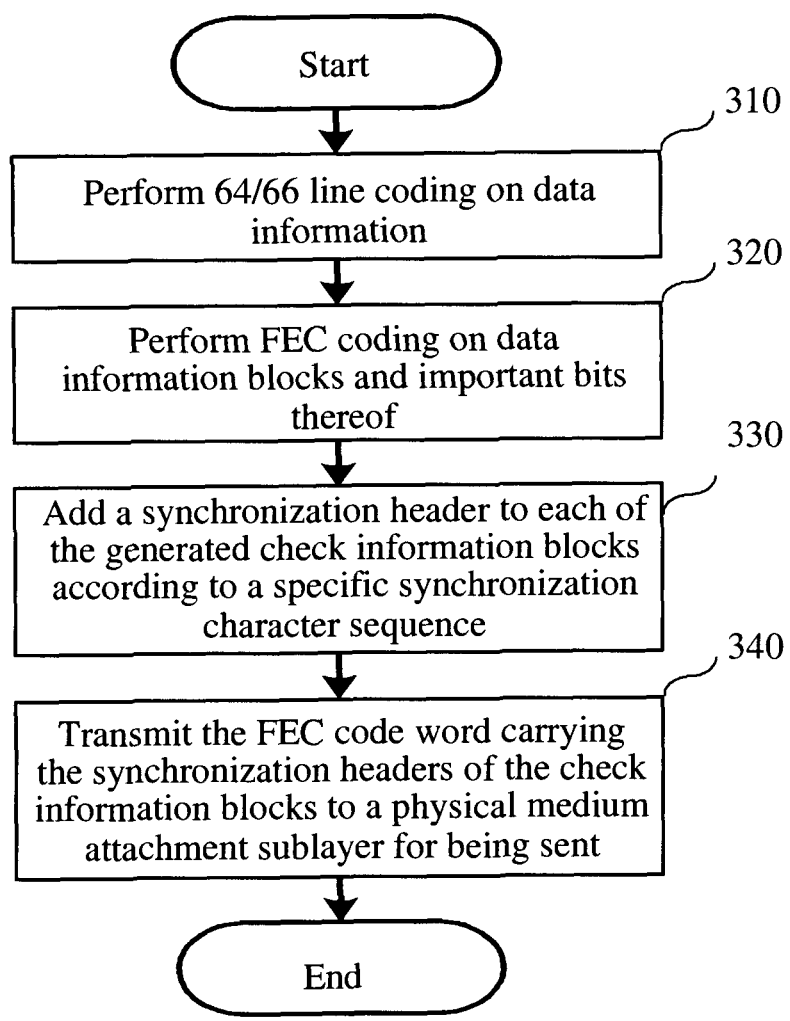
FIG. 3 is a flow chart of a method for information block coding according to a first embodiment of the disclosure.

An exemplary flow of this embodiment is as shown in FIG. 3. In step 310, 64/66 line coding is performed on data information. Specifically, the data information is divided in a unit of a 64-bit block, and a 64/66 line coder performs the 64/66 line coding on the data information blocks, that is, adds a 2-bit synchronization character to each data information block to serve as a synchronization header of the data information block. The 2-bit synchronization character may be only "01" or "10". The synchronization character of "01" indicates that the 64-bit data information block is pure data information, and the synchronization character of "10" indicates that the 64-bit data information block contains control information with or without data information. In the 2-bit synchronization character, one bit is an important bit, while the other bit is a less important bit. The important bit is not only used in the synchronization of a data information block, but also configured to indicate an information type of the data information block. The less important bit is used in the synchronization of the data information block.

Figure 4:
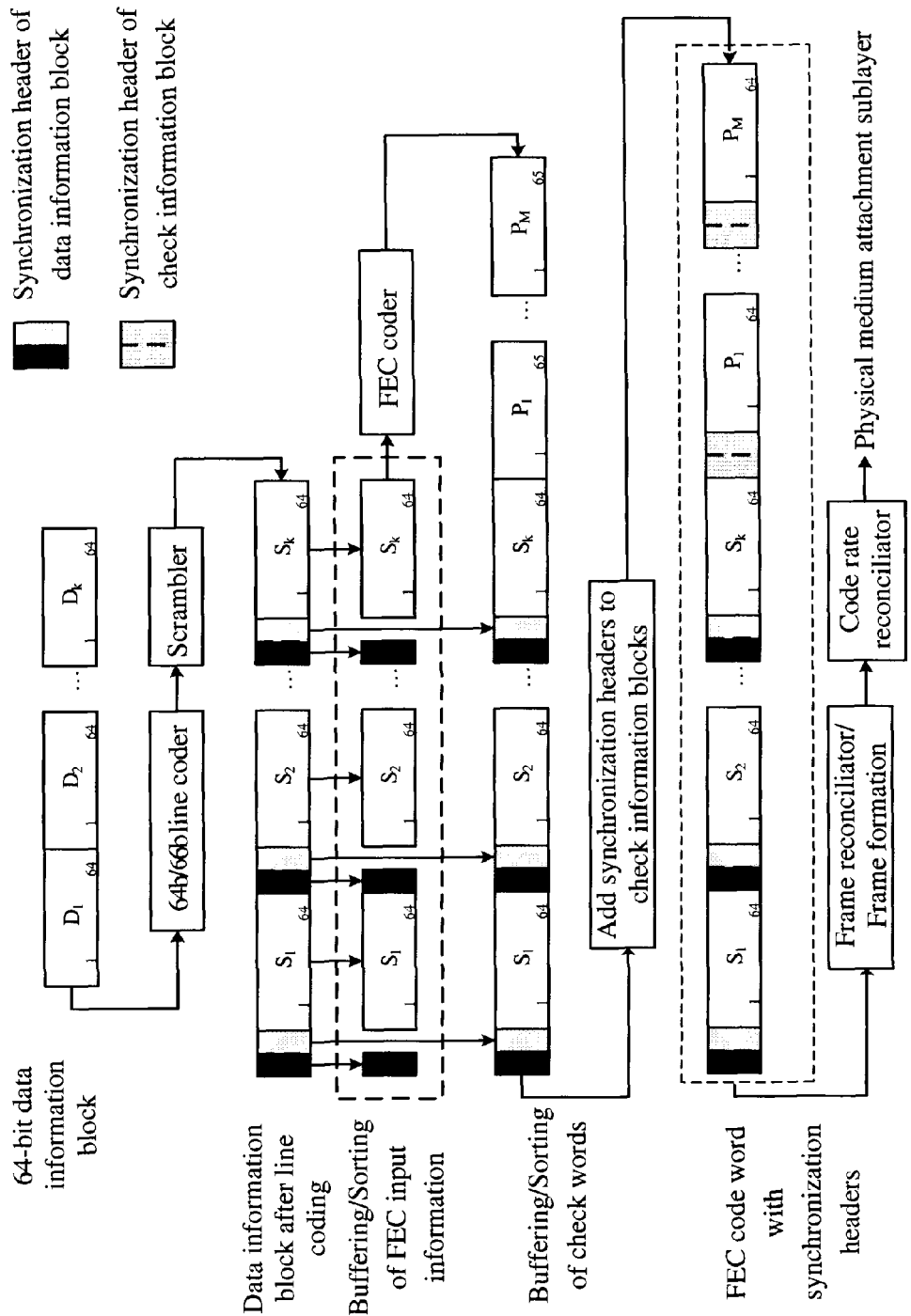
FIG. 4 is a schematic view of the method for information block coding according to the first embodiment of the disclosure.

Next, in step 320, the 64-bit data information blocks and the important bits in the synchronization headers thereof are sent to a buffer as input data bits of an FEC coder, so as to perform buffering/sorting of FEC input information. After the data bits in the buffer form an FEC coding data frame, the data bits are together sent to the FEC coder to perform FEC coding. The less important bits in the synchronization headers are not involved in the FEC coding, as shown in FIG. 4. The check information generated after the FEC coding is a multiple of 64 bits, that is to say, the check information may be divided into check information blocks $P_i$(i=1, 2, . . . M) in a unit of 64 bits.

It should be noted that, after the 64/66 line coding and before performing buffering/sorting of the FEC input information, the data information blocks further need to be scrambled.

The less important bits in the synchronization headers of the data information blocks that are primarily used for the synchronization of the data information blocks are not involved in the FEC coding, so that the amount of information to be protected by the FEC coding is reduced effectively, that is, more redundancy (check bits) are adopted to protect the least possible useful information data, so as to obtain a higher coding gain, and to increase the power budget of the EPON system. Furthermore, as the important bits indicating the data types are protected by the FEC coding, the obtained higher coding gain improves the probability of correctly determining the data types.

Next, in step 330, synchronization headers are added to the generated check information blocks. Specifically, a synchronization character serving as a synchronization header is added to each of M continuous check information blocks according to a synchronization character sequence $\{T_j\}$, in which the synchronization character added to a $j^{th}$ check information block $P_j$ is $T_j$, and the synchronization character sequence $\{T_j\}$ satisfies the following conditions:

$$\sum_{i=1}^{M-1} Diff(T_i, T_{i+1}) > 1, \text{ and } \sum_{i=1}^{M-2} Diff(T_i, T_{i+2}) > 0,$$

where $$Diff(X, Y) = \begin{cases} 0, & \text{when } X = Y \\ 1, & \text{when } X \neq Y, \end{cases}$$

$1 \le j \le M$, and $M$ is an integer greater than 3.

In this embodiment, for example, M=4. When M=4, the synchronization character sequence $\{T_j\}$ satisfying the above conditions is {00,11,11,00} or {11,00,00,11}, as listed in Table 2.

TABLE 2

| Synchronization Character Sequence $\{T_j\}$ | | | |
| --- | --- | --- | --- |
| $P_1\_h$ | $P_2\_h$ | $P_3\_h$ | $P_4\_h$ |
| 0 0 | 1 1 | 1 1 | 0 0 |
| 1 1 | 0 0 | 0 0 | 1 1 |

Figure 5:
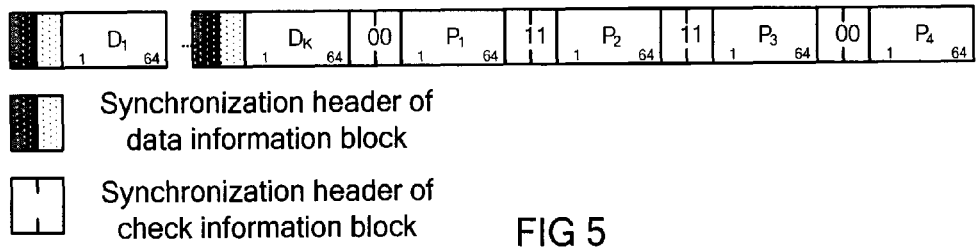
FIG. 5 is a schematic structural view of a code word adopting a synchronization character sequence of $\{00,11,11,00\}$ according to the first embodiment of the disclosure.
Figure 6:
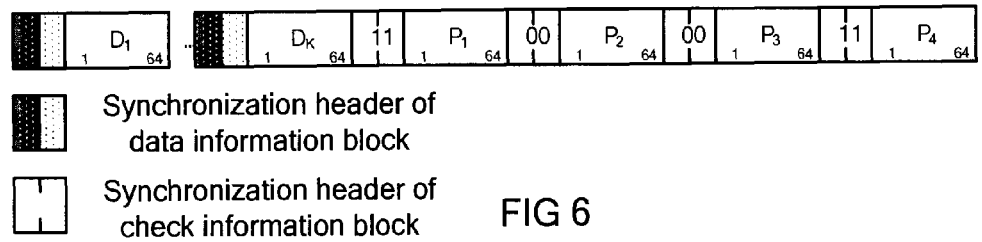
FIG. 6 is a schematic structural view of a code word adopting a synchronization character sequence of $\{11,00,00,11\}$ according to the first embodiment of the disclosure.

Therefore, if the adopted synchronization character sequence is {00,11,11,00}, the synchronization character added to the first check information block is "00", which serves as the synchronization header of the check information block; the synchronization character added to the second check information block is "11", which serves as the synchronization header of the check information block; the synchronization character added to the third check information block is "11", which serves as the synchronization header of the check information block; and the synchronization character added to the fourth check information block is "00", which serves as the synchronization header of the check information block, as shown in FIG. 5. If the adopted synchronization character sequence is {11,00,00,11}, the FEC code word after the synchronization headers are added to the generated check information blocks is as shown in FIG. 6.

Then, in step 340, the FEC code word carrying the synchronization headers of the check information blocks is transmitted to a physical medium attachment sublayer for being sent. Specifically, after the synchronization headers are added to the check information blocks, the FEC code word contains K data information blocks and corresponding synchronization headers thereof and M check information blocks and corresponding synchronization headers thereof. After the FEC code word forms a frame structure required by the system, the FEC code word is transmitted to the physical medium attachment sublayer through a code rate conciliator, so as to be sent.

Table 3 lists the minimum bit numbers leading to incorrect synchronization of the FEC code word when the optimized synchronization character sequence {00,11,11,00} or {11,00, 00,11} in this embodiment and the synchronization character sequence {00,11,11,11 } of the prior art are adopted respectively.

TABLE 3

| Synchronization Header of Check Information Block | | | | | Start Point of the Synchronized FEC Code Word and Corresponding Minimum Error Bit Number Leading to Incorrect Synchronization | | | | | | | | |
|---|---|---|---|---|---|---|---|---|---|---|---|---|---|
| M = 4 | $P_1\_h$ | $P_2\_h$ | $P_3\_h$ | $P_4\_h$ | (i − 4) to (i − N + 5) | i − 3 | i − 2 | i − 1 | i | i + 1 | i + 2 | i + 3 | (i + 4) to (i + N − 5) |
| Prior Art | 0 0 | 1 1 | 1 1 | 1 1 | 8 | 8 | 6 | 4 | 0 | 4 | 6 | 8 | 8 |
| Optimized Solution | 0 0 | 1 1 | 1 1 | 0 0 | 8 | 6 | 8 | 6 | 0 | 6 | 8 | 6 | 8 |
|  | 1 1 | 0 0 | 0 0 | 1 1 | 8 | 6 | 8 | 6 | 0 | 6 | 8 | 6 | 8 |

It can be easily seen from Table 3 that, if the solution of the prior art is adopted, when four synchronization bits in one FEC code word are erroneous at the same time, the incorrect synchronization possibly occurs. However, if the optimized solution according to this embodiment is adopted, the incorrect synchronization occurs only when at least six synchronization bits in one FEC code word are erroneous at the same time. Thus, the stability of the system is improved. The probability of the incorrect synchronization of the FEC code word is a sum of probabilities of the incorrect synchronization start points. Therefore, it is assumed that $p_e$ is an error probability of each bit, and when the solution of the prior art is adopted, the probability of the incorrect synchronization of the FEC code word $p_{(false)} \approx 2p_e^4$. Furthermore, it is assumed that a bit error rate of each bit in the 10G EPON is $10^{-3}$, and the value of N ranges from several tens to several hundreds, and at this time, $p_{(false)} \approx 2 \times (10^{-12})$. In contrast, it is assumed that $p'_e$ is an error probability of each bit according to this embodiment, and the synchronization character sequence of {11,00,00,11} is taken for example, so that the minimum bit number leading to the incorrect synchronization of the FEC code word is six. Therefore, $p'_{(false)} \approx 4p'_e{}^6$. Furthermore, it is assumed that a bit error rate of each bit in the 10G EPON is $10^{-3}$, and the value of N ranges from several tens to several hundreds, and at this time, $P'_{(false)} \approx 4 \times (10^{-18})$. As known from the above, the probability of the incorrect synchronization of the FEC code word according to this embodiment is much smaller than that of the prior art.

It should be noted that, in this embodiment, the 2-bit synchronization characters of "00" or "11" in the 10G EPON application scenario are taken for an example. In actual applications, other 2-bit synchronization characters of "01" or "10", or synchronization characters in other lengths may also be used, for example, 3-bit or 4-bit synchronization characters.

The second embodiment of the disclosure provides a method for information block coding. This embodiment is substantially the same as the first embodiment, and the difference there-between is described as follows: in the first embodiment, the number of the check information blocks M=4, and in this embodiment, the number of the check information blocks M=5. Therefore, in order to ensure that the synchronization character sequence $\{T_j\}$ satisfies the conditions of $$\sum_{i=1}^{M-1} Diff(T_i, T_{i+1}) > 1, \text{ and } \sum_{i=1}^{M-2} Diff(T_i, T_{i+2}) > 0,$$

one of the following sequences may be taken as the synchronization character sequence $\{T_j\}$: {00,00,11,00,11}; {00,00,11,11,00}; {00,11,00,00,11}; {00,11,00,11,11}; {00,11,11,00,00}; {00,11,11,00,11}; {00,11,11,11,00}; {11,00,00,00,11}; {11,00,00,11,00}; {11,00,00,11,11}; {11,00,11,00,00}; {11,00,11,11,00}; {11,11,00,00,11}; and {11,11,00,11,00}.

Table 4 lists the minimum bit numbers leading to incorrect synchronization of the FEC code word when the optimized synchronization character sequence (the sequences described above) in this embodiment and the synchronization character sequence {00,11,11,11} of the prior art are adopted respectively.

TABLE 4

| Synchronization Header of Check Information Block | | | | | | Start Point of the Synchronization FEC Code Word and Corresponding Minimum Error Bit Number Leading to Incorrect Synchronization | | | | | | | | | |
|---|---|---|---|---|---|---|---|---|---|---|---|---|---|---|---|
| M = 5 | $P_1\_h$ | $P_2\_h$ | $P_3\_h$ | $P_4\_h$ | $P_5\_h$ | (i − 5) to (i − N + 6) | i − 4 | i − 3 | i − 2 | i − 1 | i | i + 1 | i + 2 | i + 3 | i + 4 | (i + 5) to (i + N − 6) |
| Prior Art | 0 0 | 1 1 | 1 1 | 1 1 | 1 1 | 10 | 10 | 8 | 6 | 4 | 0 | 4 | 6 | 8 | 10 | 10 |
| Optimized Solution | 0 0 | 0 0 | 1 1 | 0 0 | 1 1 | 10 | 10 | 8 | 6 | 8 | 0 | 8 | 6 | 8 | 10 | 10 |
|  | 0 0 | 0 0 | 1 1 | 1 1 | 0 0 | 10 | 8 | 8 | 10 | 6 | 0 | 6 | 10 | 8 | 8 | 10 |
|  | 0 0 | 1 1 | 0 0 | 0 0 | 1 1 | 10 | 10 | 6 | 8 | 8 | 0 | 8 | 8 | 6 | 10 | 10 |
|  | 0 0 | 1 1 | 0 0 | 1 1 | 1 1 | 10 | 10 | 8 | 6 | 8 | 0 | 8 | 6 | 8 | 10 | 10 |
|  | 0 0 | 1 1 | 1 1 | 0 0 | 0 0 | 10 | 8 | 8 | 10 | 6 | 0 | 6 | 10 | 8 | 8 | 10 |
|  | 0 0 | 1 1 | 1 1 | 0 0 | 1 1 | 10 | 10 | 6 | 8 | 8 | 0 | 8 | 8 | 6 | 10 | 10 |
|  | 0 0 | 1 1 | 1 1 | 1 1 | 0 0 | 10 | 8 | 10 | 8 | 6 | 0 | 6 | 8 | 10 | 8 | 10 |
|  | 1 1 | 0 0 | 0 0 | 0 0 | 1 1 | 10 | 8 | 10 | 8 | 6 | 0 | 6 | 8 | 10 | 8 | 10 |
|  | 1 1 | 0 0 | 0 0 | 1 1 | 0 0 | 10 | 10 | 6 | 8 | 8 | 0 | 8 | 8 | 6 | 10 | 10 |
|  | 1 1 | 0 0 | 0 0 | 1 1 | 1 1 | 10 | 8 | 8 | 10 | 6 | 0 | 6 | 10 | 8 | 8 | 10 |
|  | 1 1 | 0 0 | 1 1 | 0 0 | 0 0 | 10 | 10 | 8 | 6 | 8 | 0 | 8 | 6 | 8 | 10 | 10 |
|  | 1 1 | 0 0 | 1 1 | 1 1 | 0 0 | 10 | 10 | 6 | 8 | 8 | 0 | 8 | 8 | 6 | 10 | 10 |
|  | 1 1 | 1 1 | 0 0 | 0 0 | 1 1 | 10 | 8 | 8 | 10 | 6 | 0 | 6 | 10 | 8 | 8 | 10 |
|  | 1 1 | 1 1 | 0 0 | 1 1 | 0 0 | 10 | 10 | 8 | 6 | 8 | 0 | 8 | 6 | 8 | 10 | 10 |

As easily seen from Table 4 that, if the solution of the prior art is adopted, when four synchronization bits in one FEC code word have errors at the same time, the incorrect synchronization possibly occurs. However, if the optimized solution according to this embodiment is adopted, the incorrect synchronization occurs only when at least six synchronization bits in one FEC code word have errors at the same time.

The third embodiment of the disclosure provides a method for information block coding. This embodiment is substantially the same as the first embodiment, and the difference there-between is described as follows: in the first embodiment, the number of the check information blocks M=4, and in this embodiment, the number of the check information blocks M=6. Therefore, in order to ensure that the synchronization character sequence $\{T_j\}$ satisfies the conditions of $$\sum_{i=1}^{M-1} Diff(T_i, T_{i+1}) > 1, \text{ and } \sum_{i=1}^{M-2} Diff(T_i, T_{i+2}) > 0,$$

one of the following sequences may be taken as the synchronization character sequence $\{T_j\}$: $\{00,00,11,11,00,11\}$; $\{00,11,00,00,11,11\}$; $\{00,11,00,11,11,00\}$; $\{00,11,11,00,11,00\}$; $\{11,00,00,11,00,11\}$; $\{11,00,11,00,00,11\}$; $\{11,00,11,11,00,00\}$; and $\{11,11,00,00,11,00\}$.

Table 5 lists the minimum bit numbers leading to incorrect synchronization of the FEC code word when the optimized synchronization character sequence (the sequences described above) in this embodiment and the synchronization character sequence $\{00,11,11,11\}$ of the prior art are adopted respectively.

TABLE 5

| Synchronization Header of Check Information Block | | | | | | | Start Point of the Synchronized FEC Code Word and Corresponding Minimum Error Bit Number Leading to Incorrect Synchronization | | | | | | | | | | | |
|---|---|---|---|---|---|---|---|---|---|---|---|---|---|---|---|---|---|---|
| | | | | | | | (i − 6) | | | | | | | | | | | (i + 6) |
| M = 6 | $P_1$ | $P_2$ | $P_3$ | $P_4$ | $P_5$ | $P_6$ | to (i − N + 7) | i − 5 | i − 4 | i − 3 | i − 2 | i − 1 | i | i + 1 | i + 2 | i + 3 | i + 4 | i + 5 | to (i + N − 7) |
| Prior Art | 0 0 | 1 1 | 1 1 | 1 1 | 1 1 | 1 1 | 12 | 12 | 10 | 8 | 6 | 4 | 0 | 4 | 6 | 8 | 10 | 12 | 12 |
| Optimized Solution | 0 0 | 0 0 | 1 1 | 1 1 | 0 0 | 1 1 | 12 | 12 | 10 | 8 | 10 | 8 | 0 | 8 | 10 | 8 | 10 | 12 | 12 |
| | 0 0 | 1 1 | 0 0 | 0 0 | 1 1 | 1 1 | 12 | 12 | 10 | 8 | 10 | 8 | 0 | 8 | 10 | 8 | 10 | 12 | 12 |
| | 0 0 | 1 1 | 0 0 | 1 1 | 1 1 | 0 0 | 12 | 10 | 12 | 8 | 8 | 10 | 0 | 10 | 8 | 8 | 12 | 10 | 12 |
| | 0 0 | 1 1 | 1 1 | 0 0 | 1 1 | 0 0 | 12 | 10 | 12 | 8 | 8 | 10 | 0 | 10 | 8 | 8 | 12 | 10 | 12 |
| | 1 1 | 0 0 | 0 0 | 1 1 | 0 0 | 1 1 | 12 | 10 | 12 | 8 | 8 | 10 | 0 | 10 | 8 | 8 | 12 | 10 | 12 |
| | 1 1 | 0 0 | 1 1 | 0 0 | 0 0 | 1 1 | 12 | 10 | 12 | 8 | 8 | 10 | 0 | 10 | 8 | 8 | 12 | 10 | 12 |
| | 1 1 | 0 0 | 1 1 | 1 1 | 0 0 | 0 0 | 12 | 12 | 10 | 8 | 10 | 8 | 0 | 8 | 10 | 8 | 10 | 12 | 12 |
| | 1 1 | 1 1 | 0 0 | 0 0 | 1 1 | 0 0 | 12 | 12 | 10 | 8 | 10 | 8 | 0 | 8 | 10 | 8 | 10 | 12 | 12 |

As easily seen from Table 5 that, if the solution of the prior art is adopted, when four synchronization bits in one FEC code word have errors at the same time, the incorrect synchronization possibly occurs. However, if the optimized solution according to this embodiment is adopted, the incorrect synchronization occurs only when at least eight synchronization bits in one FEC code word have errors at the same time.

After the number of the check information blocks M is determined, a synchronization character sequence may be selected from the optimized solutions of a corresponding table (for example, Table 3, when M=4). Thus, the synchronization at the receiving end is accelerated. In addition, when M is 2 or 3, other alternative synchronization character sequences are also available, which are listed in Table 6 and Table 7 respectively.

TABLE 6

| Synchronization Header of Check Information Block | | | Start Point of the Synchronized FEC Code Word and Corresponding Minimum Error Bit Number Leading to Incorrect Synchronization | | | | | | | |
|---|---|---|---|---|---|---|---|---|---|---|
| | | | (i − 4) to | | | | | | | (i + 4) to |
| M = 2 | $P_1\_h$ | $P_2\_h$ | (i − N + 5) | i − 3 | i − 2 | i − 1 | i | i + 1 | i + 2 | i + 3 | (i + N − 5) |
| Prior Art | 0 0 | 1 1 | 4 | 4 | 4 | 4 | 0 | 4 | 4 | 4 | 4 |
| Alternative Solution | 1 1 | 0 0 | 4 | 4 | 4 | 4 | 0 | 4 | 4 | 4 | 4 |

TABLE 7

| Synchronization Header of Check Information Block | | | Start Point of the Synchronized FEC Code Word and Corresponding Minimum Error Bit Number Leading to Incorrect Synchronization | | | | | | | | |
|---|---|---|---|---|---|---|---|---|---|---|---|
| M = 3 | $P_1\_h$ | $P_2\_h$ | $P_3\_h$ | (i − 4) to (i − N + 5) | i − 3 | i − 2 | i − 1 | i | i + 1 | i + 2 | i + 3 | (i + 4) to (i + N − 5) |
| Prior Art | 0 0 | 1 1 | 1 1 | 6 | 6 | 6 | 4 | 0 | 4 | 6 | 6 | 6 |
| Alternative Solution | 0 0 | 0 0 | 1 1 | 6 | 6 | 6 | 4 | 0 | 4 | 6 | 6 | 6 |
| | 0 0 | 1 1 | 0 0 | 6 | 6 | 4 | 6 | 0 | 6 | 4 | 6 | 6 |
| | 1 1 | 0 0 | 0 0 | 6 | 6 | 6 | 4 | 0 | 4 | 6 | 6 | 6 |
| | 1 1 | 0 0 | 1 1 | 6 | 6 | 4 | 6 | 0 | 6 | 4 | 6 | 6 |
| | 1 1 | 1 1 | 0 0 | 6 | 6 | 4 | 6 | 0 | 4 | 6 | 6 | 6 |

Figure 7:
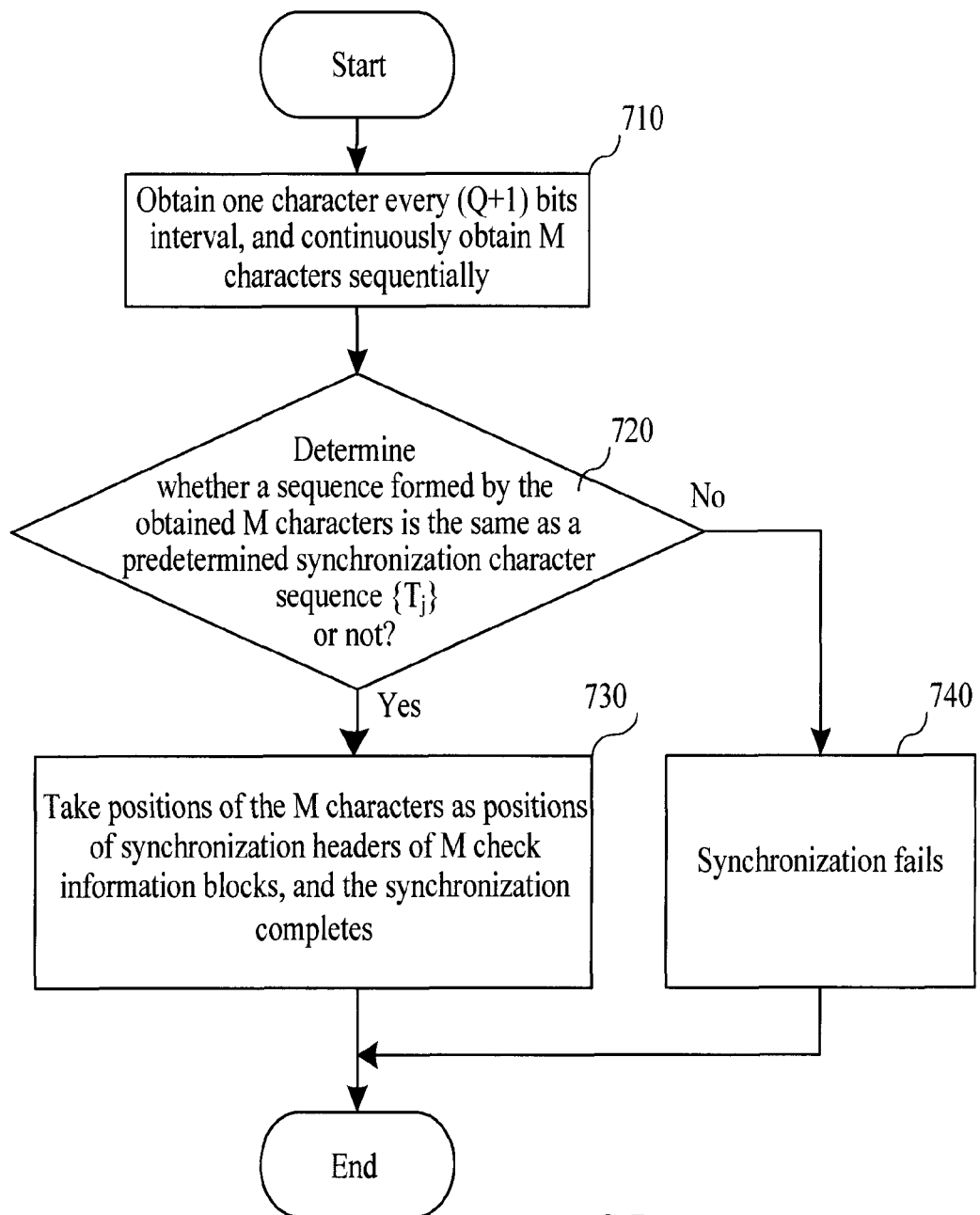
FIG. 7 is a flow chart of a method for synchronization detecting according to a fourth embodiment of the disclosure.

The fourth embodiment of the disclosure provides a method for synchronization detecting. FIG. 7 shows a specific process of the fourth embodiment.

In step 710, a synchronizer at a receiving end obtains one character every Q bits in a continuous bit stream, and continuously obtains M characters sequentially. Here, Q is a number of bits of an information block. For example, one 2-bit character is obtained in every 65 bits interval in the continuous bit stream, and 3 characters are continuously obtained sequentially (the bit number of an information block is 64 bits, 3 check information blocks are generated at a sending end, and the synchronization header has 2 bits). In this embodiment, the information blocks are check information blocks of FEC code words in 10G EPON, and the synchronization characters are "00" or "11".

Then, in step 720, the synchronizer determines whether a sequence formed by the obtained M characters is the same as a predetermined synchronization character sequence $\{T_j\}$ or not. The synchronization character sequence $\{T_j\}$ satisfies the following conditions:

$$\sum_{i=1}^{M-1} Diff(T_i, T_{i+1}) > 1, \text{ and } \sum_{i=1}^{M-2} Diff(T_i, T_{i+2}) > 0,$$

where $$Diff(X, Y) = \begin{cases} 0, & \text{when } X = Y \\ 1, & \text{when } X \neq Y, \end{cases}$$

$1 \leq j \leq M$, and M is an integer greater than 3.

Specifically, when M=4, the synchronization character sequence $\{T_j\}$ satisfying the above conditions is $\{00,11,11,00\}$ or $\{11,00,00,11\}$.

When M=5, the synchronization character sequence $\{T_j\}$ satisfying the above conditions is one of the following sequences: $\{00,00,11,00,11\}$; $\{00,00,11,11,00\}$; $\{00,11,00,00,11\}$; $\{00,11,00,11,11\}$; $\{00,11,11,00,00\}$; $\{00,11,11,00,11\}$; $\{00,11,11,11,00\}$; $\{11,00,00,00,11\}$; $\{11,00,00,11,00\}$; $\{11,00,00,11,11\}$; $\{11,00,11,00,00\}$; $\{11,00,11,11,00\}$; $\{11,11,00,00,11\}$; and $\{11,11,00,11,00\}$.

When M=6, the synchronization character sequence $\{T_j\}$ satisfying the above conditions is one of the following sequences: $\{00,00,11,11,00,11\}$; $\{00,11,00,00,11,11\}$; $\{00,11,00,11,11,00\}$; $\{00,11,11,00,11,00\}$; $\{11,00,00,11,00,11\}$; $\{11,00,11,00,00,11\}$; $\{11,00,11,11,00,00\}$; and $\{11,11,00,00,11,00\}$.

Therefore, according to the number M of the check information blocks, the synchronizer can determine whether the sequence formed by the obtained M characters is the same as the predetermined synchronization character sequence $\{T_j\}$ or not. If yes, step 730 is performed; otherwise, step 740 is performed.

In step 730, the sequence formed by the obtained M characters is the same as the predetermined synchronization character sequence $\{T_j\}$, which indicates that the synchronization is successful. Therefore, in this step, the locations of the M characters may be taken as the positions of the synchronization headers of M check information blocks, and the synchronization operation is completed.

If the sequence formed by the obtained M characters is different from the predetermined synchronization character sequence $\{T_j\}$, it indicates that the synchronization fails. Therefore, in step 740, the synchronizer indicates that the synchronization fails.

It should be noted that, in this embodiment, the 2-bit synchronization characters of "00" or "11" in the 10G EPON application scenario are taken for an example. In actual applications, other 2-bit synchronization characters of "01" or "10", or synchronization characters in other lengths may also be used, for example, 3-bit or 4-bit synchronization characters.

Figure 8:
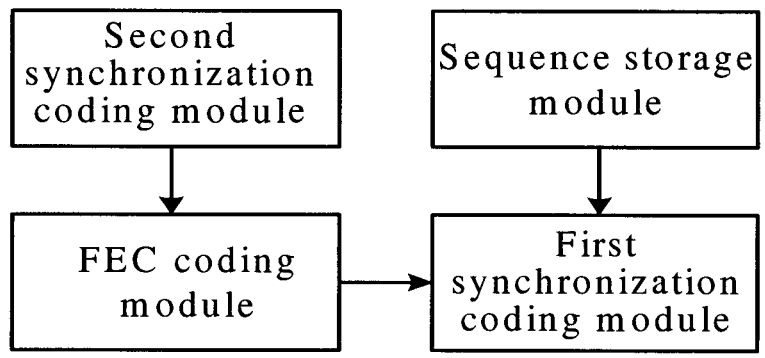
FIG. 8 is a schematic structural view of a device for information block coding according to a fifth embodiment of the disclosure.

The fifth embodiment of the disclosure provides a device for information block coding. As shown in FIG. 8, the device includes a sequence storage module and a first synchronization coding module. The sequence storage module may be configured to store a synchronization character sequence $\{T_j\}$ satisfying the following conditions:

$$\sum_{i=1}^{M-1} Diff(T_i, T_{i+1}) > 1, \text{ and } \sum_{i=1}^{M-2} Diff(T_i, T_{i+2}) > 0,$$

where $$Diff(X, Y) = \begin{cases} 0, & \text{when } X = Y \\ 1, & \text{when } X \neq Y, \end{cases}$$

$1 \leq j \leq M$, and M is an integer greater than 3. The first synchronization coding module may be configured to add a synchronization character serving as a synchronization header to each of M continuous information blocks according to the synchronization character sequence $\{T_j\}$ stored in the sequence storage module, in which the synchronization character added to a $j^{th}$ information block $P_j$ is $T_j$. The device according to this embodiment is a device for coding the check information blocks of FEC code words in 10G EPON, the information blocks are check information blocks of the FEC code words and the synchronization characters are "00" or "11". Therefore, the device further includes a second synchronization coding module and an FEC coding module. The second synchronization coding module may be configured to add a synchronization header to each data information block, in which the synchronization header contains an important bit for indicating the type of the corresponding data information block. The FEC coding module may be configured to perform FEC coding on a predetermined number of data information blocks output by the second synchronization coding module and with the important bits in the synchronization headers of the data information blocks to generate M check information blocks, and output the check information blocks to the first synchronization coding module.

As derived from the above equations, when M=4, the synchronization character sequence $\{T_j\}$ satisfying the conditions is $\{00,11,11,00\}$ or $\{11,00,00,11\}$, in which a minimum bit number leading to the incorrect synchronization of the FEC code word is six (as shown in Table 3); that is, the incorrect synchronization does not occur until at least six synchronization bits in one FEC code word are erroneous at the same time, so that the stability of the system is improved.

When M=5, the synchronization character sequence $\{T_j\}$ satisfying the conditions is one of the following sequences: $\{00,00,11,00,11\}$; $\{00,00,11,11,00\}$; $\{00,11,00,00,11\}$; $\{00,11,00,11,11\}$; $\{00,11,11,00,00\}$; $\{00,11,11,00,11\}$; $\{00,11,11,11,00\}$; $\{11,00,00,00,11\}$; $\{11,00,00,11,00\}$; $\{11,00,00,11,11\}$; $\{11,00,11,00,00\}$; $\{11,00,11,11,00\}$; $\{11,11,00,00,11\}$; and $\{11,11,00,11,00\}$.

As known from Table 4, when M=5, the minimum bit number of errors leading to the incorrect synchronization of the FEC code word is also six.

When M=6, the synchronization character sequence $\{T_j\}$ satisfying the conditions is one of the following sequences: $\{00,00,11,11,00,11\}$; $\{00,11,00,00,11,11\}$; $\{00,11,00,11,11,00\}$; $\{00,11,11,00,11,00\}$; $\{11,00,00,11,00,11\}$; $\{11,00,11,00,00,11\}$; $\{11,00,11,11,00,00\}$; and $\{11,11,00,00,11,00\}$.

As known from Table 5, when M=6, the minimum bit number of errors leading to the incorrect synchronization of the FEC code word is eight.

Figure 9:
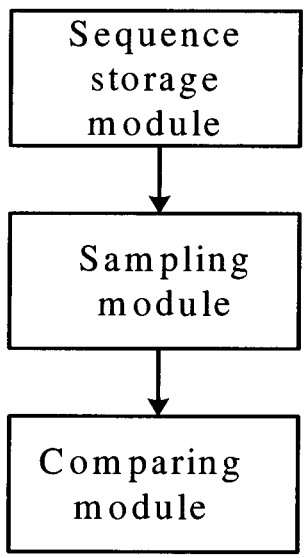
FIG. 9 is a schematic structural view of a device for synchronization detecting according to a sixth embodiment of the disclosure.

The sixth embodiment of the disclosure provides a device for synchronization detecting. As shown in FIG. 9, the device includes a sequence storage module, a sampling module, and a comparing module. The sequence storage module may be configured to store a synchronization character sequence $\{T_j\}$ satisfying the following conditions:

$$\sum_{i=1}^{M-1} \mathit{Diff}(T_i, T_{i+1}) > 1, \text{ and } \sum_{i=1}^{M-2} \mathit{Diff}(T_i, T_{i+2}) > 0,$$

where $$\mathit{Diff}(X, Y) = \begin{cases} 0, & \text{when } X = Y \\ 1, & \text{when } X \neq Y, \end{cases}$$

$1 \leq j \leq M$, and M is an integer greater than 3. The sampling module may be configured to obtain one character every other Q bits in an input continuous bit stream, and continuously obtain M characters sequentially to form a sample sequence. The comparing module may be configured to compare the sample sequence obtained by the sampling module with the synchronization character sequence stored in the sequence storage module, and record locations of the M characters in the sample sequence as locations of synchronization headers of M information blocks if the sample sequence is the same as the synchronization character sequence and meanwhile output a signal indicating that the synchronization is successful, or output a signal indicating that the synchronization fails if the sample sequence is different from the synchronization character sequence.

The device according to this embodiment is a device for synchronization detecting in the 10G EPON, the information blocks are check information blocks of FEC code words in the 10G EPON, and the synchronization characters are "00" or "11". Therefore, when M=4, the synchronization character sequence $\{T_j\}$ satisfying the conditions is $\{00,11,11,00\}$ or $\{11,00,00,11\}$.

When M=5, the synchronization character sequence $\{T_j\}$ satisfying the conditions is one of the following sequences: $\{00,00,11,00,11\}$; $\{00,00,11,11,00\}$; $\{00,11,00,00,11\}$; $\{00,11,00,11,11\}$; $\{00,11,11,00,00\}$; $\{00,11,11,00,11\}$; $\{00,11,11,11,00\}$; $\{11,00,00,00,11\}$; $\{11,00,00,11,00\}$; $\{11,00,00,11,11\}$; $\{11,00,11,00,00\}$; $\{11,00,11,11,00\}$; $\{11,11,00,00,11\}$; and $\{11,11,00,11,00\}$.

When M=6, the synchronization character sequence $\{T_j\}$ satisfying the conditions is one of the following sequences: $\{00,00,11,11,00,11\}$; $\{00,11,00,00,11,11\}$; $\{00,11,00,11,11,00\}$; $\{00,11,11,00,11,00\}$; $\{11,00,00,11,00,11\}$; $\{11,00,11,00,00,11\}$; $\{11,00,11,11,00,00\}$; and $\{11,11,00,00,11,00\}$.

As easily known from the above, when M is greater than or equal to 4, the incorrect synchronization does not occur until at least six synchronization bits in one FEC code word are erroneous at the same time. Thus, the stability of the system is improved.

To sum up, in the embodiments of the disclosure, the synchronization character sequence $\{T_j\}$ satisfying the following conditions is used in the synchronization coding and synchronization detecting:

$$\sum_{i=1}^{M-1} \mathit{Diff}(T_i, T_{i+1}) > 1, \text{ and } \sum_{i=1}^{M-2} \mathit{Diff}(T_i, T_{i+2}) > 0,$$

where $$\mathit{Diff}(X, Y) = \begin{cases} 0, & \text{when } X = Y \\ 1, & \text{when } X \neq Y, \end{cases}$$

$1 \leq j \leq M$, and M is an integer greater than 3.

The incorrect synchronization problem does not occur until at least four synchronization characters have errors at the same time in the synchronization headers of M continuous information blocks.

When the synchronization character sequence is applied in the check information blocks of FEC code words in the 10G EPON, the incorrect synchronization problem does not occur until six or more synchronization bits in one FEC code word are erroneous at the same time.

When M=4, $\{00,11,11,00\}$ or $\{11,00,00,11\}$ is taken as the synchronization character sequence, and the minimum erroneous bit number leading to the incorrect synchronization of the FEC code word is six.

When M=5, one of the following sequences is taken as the synchronization character sequence: $\{00,00,11,00,11\}$; $\{00,00,11,11,00\}$; $\{00,11,00,00,11\}$; $\{00,11,00,11,11\}$; $\{00,11,11,00,00\}$; $\{00,11,11,00,11\}$; $\{00,11,11,11,00\}$; $\{11,00,00,00,11\}$; $\{11,00,00,11,00\}$; $\{11,00,00,11,11\}$; $\{11,00,11,00,00\}$; $\{11,00,11,11,00\}$; $\{11,11,00,00,11\}$; and $\{11,11,00,11,00\}$, and the minimum erroneous bit number leading to the incorrect synchronization of the FEC code word is six.

When M=6, one of the following sequences is taken as the synchronization character sequence: $\{00,00,11,11,00,11\}$;

{00,11,00,00,11,11};
{00,11,11,00,11,00};
{11,00,11,00,00,11};
{11,11,00,00,11,00}, and the minimum erroneous bit number leading to the incorrect synchronization of the FEC code word is eight.

{00,11,00,11,11,00};
{11,00,00,11,00,11};
{11,00,11,11,00,00}; and

The check information blocks are obtained by performing FEC coding on the data information blocks and the important bits in the synchronization headers thereof, in which the important bits may be configured to indicate the information data type of the same line coding blocks. Some bits in the synchronization headers that are primarily used for the synchronization of data information blocks are not involved in the FEC coding, so that the amount of information to be protected by the FEC coding is reduced effectively, that is, more redundancy (check bits) are adopted to protect the least possible useful information data, so as to obtain a higher coding gain, and to increase the power budget of the EPON system. Furthermore, as the bits indicating the data types are protected by the FEC coding, the obtained higher coding gain improves the probability of correctly determining the data types.

It should be noted that in the disclosure, the 10G EPON is exemplary. The disclosure can also be applied in other Ethernet technologies besides the 10G EPON, or in other technologies requiring the synchronization operation.

The disclosure is illustrated and described with reference to some preferred embodiments of the disclosure. However, persons of ordinary skill in the art should understand that variations may be made to the form or details without departing from the spirit and scope of the disclosure.

What is claimed is:

1. A method for synchronization detecting in an Ethernet Passive Optical Network, comprising:

obtaining, by a synchronizer, M characters sequentially by getting a character from every other Q a check information bits in a continuous bit stream, wherein the Q is a number of bits of a check information block and the Q is 64, wherein the characters is 2 bits for synchronization and the characters comprises "00" or "11";

determining, by the synchronizer, whether a sequence formed by the obtained M characters is the same as a predetermined synchronization character sequence $\{Tj\}$ to determine whether the synchronization succeeds;

setting, by the synchronizer, locations of the M characters as locations of synchronization headers of M check information blocks, wherein the synchronization character sequence $\{Tj\}$ satisfies the following conditions:

$$\sum_{i=1}^{M-1} \mathit{Diff}(T_i, T_{i+1}) > 1, \text{ and } \sum_{i=1}^{M-2} \mathit{Diff}(T_i, T_{i+2}) > 0, \text{ and}$$

wherein $$\mathit{Diff}(X, Y) = \begin{cases} 0, & \text{when } X = Y \\ 1, & \text{when } X \neq Y, \end{cases}$$

$1 \leq j \leq M$, $M$ is an integer greater than 3, and $Q$ is a number of bits of an information block.

2. The method according to claim 1, wherein M=4; and
the synchronization character sequence $\{Tj\}$ is $\{A,B,B,A\}$ or $\{B,A,A,B\}$, wherein A is different from B.

3. The method according to claim 1, wherein M=5; and
the synchronization character sequence $\{Tj\}$ is one of the following sequences:
{A,A,B,A,B}; {A,A,B,B,A}; {A,B,A,A,B}; {A,B,A,B,B};
{A,B,B,A,A}; {A,B,B,A,B}; {A,B,B,B,A}; {B,A,A,A,B};
{B,A,A,B,A}; {B,A,A,B,B}; {B,A,B,A,A}; {B,A,B,B,A};
{B,B,A,A,B}; {B,B,A,B,A}, wherein A is different from B.

4. The method according to claim 1, wherein:
the information blocks include check information blocks of forward error correction code in a 10 gigabit per second Ethernet Passive Optical Network, and
synchronization characters in the synchronization character sequence are "00" or "11".

* * * * *